United States Patent
Kondo et al.

(10) Patent No.: US 12,112,955 B2
(45) Date of Patent: Oct. 8, 2024

(54) FILM FORMATION APPARATUS, FILM FORMATION METHOD, AND METHOD FOR FABRICATING SEMICONDUCTOR DEVICE

(71) Applicant: KIOXIA CORPORATION, Tokyo (JP)

(72) Inventors: Yusuke Kondo, Yokkaichi Mie (JP); Soichi Yamazaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 440 days.

(21) Appl. No.: 17/462,366

(22) Filed: Aug. 31, 2021

(65) Prior Publication Data

US 2022/0301884 A1    Sep. 22, 2022

(30) Foreign Application Priority Data

Mar. 18, 2021   (JP) ................. 2021-044839

(51) Int. Cl.
```
H01L 23/00      (2006.01)
C23C 14/04      (2006.01)
C23C 14/06      (2006.01)
C23C 14/34      (2006.01)
H01J 37/32      (2006.01)
H01L 21/311     (2006.01)
H10B 69/00      (2023.01)
```
(52) U.S. Cl.
CPC ...... *H01L 21/31144* (2013.01); *C23C 14/042* (2013.01); *C23C 14/0605* (2013.01); *C23C 14/34* (2013.01); *H01J 37/32651* (2013.01); *H10B 69/00* (2023.02); *H01J 2237/332* (2013.01)

(58) Field of Classification Search
CPC ............. H01L 21/31144; C23C 14/042; H01J 37/32651
See application file for complete search history.

(56) References Cited

U.S. PATENT DOCUMENTS

| | | |
|---|---|---|
| 2010/0052177 A1 | 3/2010 | Meijer |
| 2022/0290327 A1 | 9/2022 | Taketomi et al. |

FOREIGN PATENT DOCUMENTS

| | | | |
|---|---|---|---|
| CN | 101189720 | A | 5/2008 |
| JP | 2001-329366 | A | 11/2001 |
| JP | 2004-356363 | A | 12/2004 |
| JP | 2007-083726 | A | 4/2007 |
| JP | 2008-135546 | A | 6/2008 |
| JP | 2008-139424 | A | 6/2008 |
| JP | 2012-022941 | A | 2/2012 |
| JP | 2012-233234 | A | 11/2012 |
| JP | 6795123 | B1 | 12/2020 |

OTHER PUBLICATIONS

Notice of Reasons for Refusal mailed May 7, 2024, in corresponding Japanese Patent Application No. 2021-044839, 6 pages (with Translation).

*Primary Examiner* — Anthony Ho
(74) *Attorney, Agent, or Firm* — Kim & Stewart LLP

(57) ABSTRACT

A film forming apparatus includes an electrode, a target holder configured to hold a film forming target so as to face the electrode, and a masking shield holder configured to hold a masking shield between the electrode and the target holder. The masking shield includes a lattice portion having a plurality of openings therein and a frame portion supporting the lattice portion.

10 Claims, 15 Drawing Sheets

FILM FORMATION APPARATUS, FILM FORMATION METHOD, AND METHOD FOR FABRICATING SEMICONDUCTOR DEVICE

CROSS-REFERENCE TO RELATED APPLICATION(S)

This application is based upon and claims the benefit of priority from Japanese Patent Application No. 2021-044839, filed Mar. 18, 2021, the entire contents of which are incorporated herein by reference.

FIELD

Embodiments described herein relate generally to a film formation apparatus, a film formation method, and a method for fabricating a semiconductor device.

BACKGROUND

In a process of manufacturing a semiconductor device, such as NAND flash memory, after a film to be processed is formed on a front surface of a semiconductor substrate, a mask layer is then formed so as to cover the film to be processed. When a film is formed so as to cover the entire planar surface of a "body" such as a semiconductor substrate, wafer, or the like, stress in the film thus formed may cause warpage in the body.

DETAILED DESCRIPTION

Figure 1:
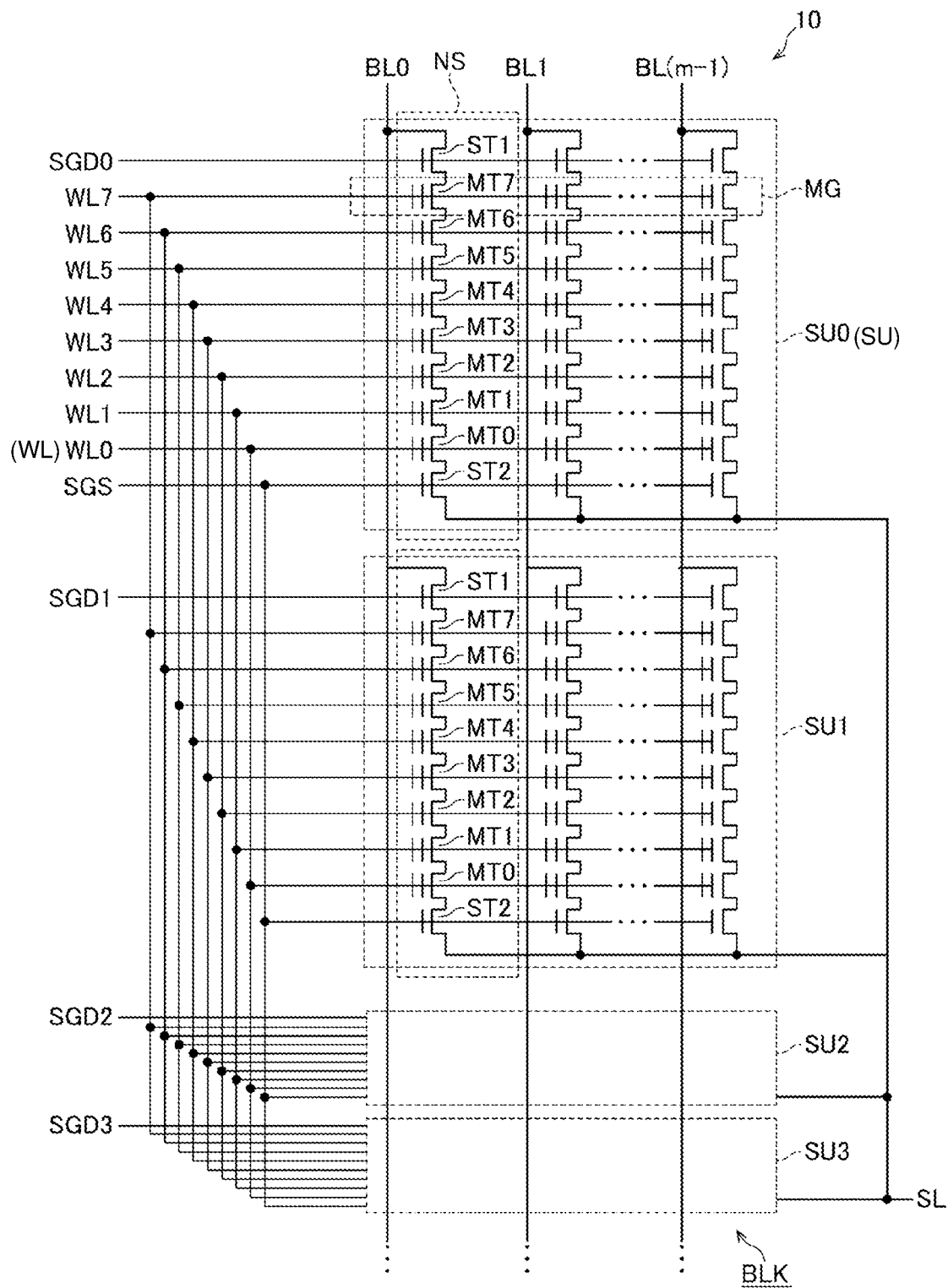
FIG. 1 is an equivalent circuit diagram showing a circuit configuration of a semiconductor device.

Embodiments provide a film formation apparatus, a film forming method, and a method for manufacturing a semiconductor device which can reduce warpage.

In general, according to an embodiment, a film forming apparatus includes an electrode, a target holder configured to hold a film forming target so as to face the electrode, and a masking shield holder configured to hold a masking shield between the electrode and the target holder. The masking shield includes a lattice portion having a plurality of openings therein and a frame portion supporting the lattice portion.

Hereinafter, certain example embodiments will be described with reference to the attached drawings. To facilitate understanding of explanations, the same elements are denoted by the same reference symbols in the drawings and overlapping explanations of such repeated aspects may be omitted.

A film forming apparatus 500 according to an embodiment is an apparatus that can be used in a process of manufacturing a semiconductor device 10. The film forming apparatus 500 is configured as an apparatus for forming a mask 100 on a semiconductor substrate 20. Semiconductor substrate 20 is, for example, a silicon wafer of the like. Before a film forming method that is implemented by the film forming apparatus 500 is described, the general configuration of the semiconductor device 10 being fabricated in this example will be described first.

The semiconductor device 10 is, for example, a semiconductor storage device such as NAND flash memory. FIG. 1 shows a configuration of the semiconductor device 10 as an equivalent circuit diagram. The semiconductor device 10 is configured with a plurality of blocks BLK; however, in FIG. 1, only one block BLK of these plurality of blocks BLK is shown. The other blocks BLK of the semiconductor device 10 each have the same configuration as the configuration shown in FIG. 1. A semiconductor device 10 including these blocks BLK is provided in each chip (die) of the semiconductor substrate 20 by the manufacturing process.

As shown in FIG. 1, the block BLK includes four string units SU (SU0 to SU3), for example. Moreover, each string unit SU includes a plurality of NAND strings NS. Each of the NAND strings NS includes eight memory cell transistors MT (MT0 to MT7), a select transistor ST1, and a select transistor ST2.

The number of memory cell transistors is not limited to eight; for example, 32, 48, 64, or 96 memory cell transistors may be provided. Each of the select transistors ST1 and ST2 may be a plurality of transistors, rather than just a single transistor, to improve cutoff characteristics, for example. Furthermore, in some examples, a dummy cell transistor may be provided between the memory cell transistors and each of the select transistors ST1 and ST2.

The memory cell transistors MT are connected in series between a select transistor ST1 and a select transistor ST2. The memory cell transistor MT7 is on one-end side of the series and is connected to the source of the select transistor ST1, and the memory cell transistor MT0 on the other-end side of the series and is connected to the drain of the select transistor ST2.

The gates of the select transistors ST1 of the string units SU0 to SU3 are connected to select gate lines SGD0 to SGD3, respectively. The gates of the select transistors ST2 in string units SU in the same block BLK are connected in common to the same select gate line SGS. The control gates of the memory cell transistors MT0 to MT7 in the same block BLK are respectively connected in common to word lines WL0 to WL7. That is, a plurality of string units SU0 to SU3 in the same block BLK share the same word lines WL0 to WL7 and the select gate line SGS, whereas, even within the same block BLK, the select gate line SGD is separately provided for each of the string units SU0 to SU3.

In the semiconductor device 10, a total of m bit lines BL (BL0, BL1 . . . BL(m−1)) are provided. In this context, "m" is an integer corresponding to the number of NAND strings NS in a string unit SU. The drain of the select transistor ST1 of each NAND string NS is connected to a corresponding bit line BL. The source of the select transistor ST2 is connected to a source line SL. The source line SL is connected in common to the sources of the plurality of select transistors ST2 of the block BLK.

The data stored in the memory cell transistors MT in the same block BLK is erased at the same time in an erase operation. On the other hand, reading and writing of data is performed on a plurality of memory cell transistors MT connected to the same word line WL and belonging to the same string unit SU. In this example, each memory cell can store 3-bit data including a higher-order bit, a middle-order bit, and a lower-order bit.

That is, as the write mode of writing data to a memory cell transistor MT, the semiconductor device 10 according to the present embodiment adopts the triple-level cell (TLC) mode in which 3-bit data is stored in each memory cell transistor MT. In place of this mode, in other examples, as the write mode of writing data to the memory cell transistor MT, multi-level cell (MLC) mode in which 2-bit data is stored in each memory cell transistor MT, single-level cell (SLC) mode in which 1-bit data is stored in each memory cell transistor MT, or the like may be adopted.

A set of 1-bit data that can be written to the plurality of memory cell transistors MT connected to the same word line WL and belonging to the same string unit SU store is referred to as a "page". In FIG. 1, one of such set is denoted by a reference sign "MG".

When 3-bit data is stored in one memory cell transistor MT, a set of a plurality of memory cell transistors MT connected to a common word line WL in one string unit SU can store three pages of data.

Figure 2:
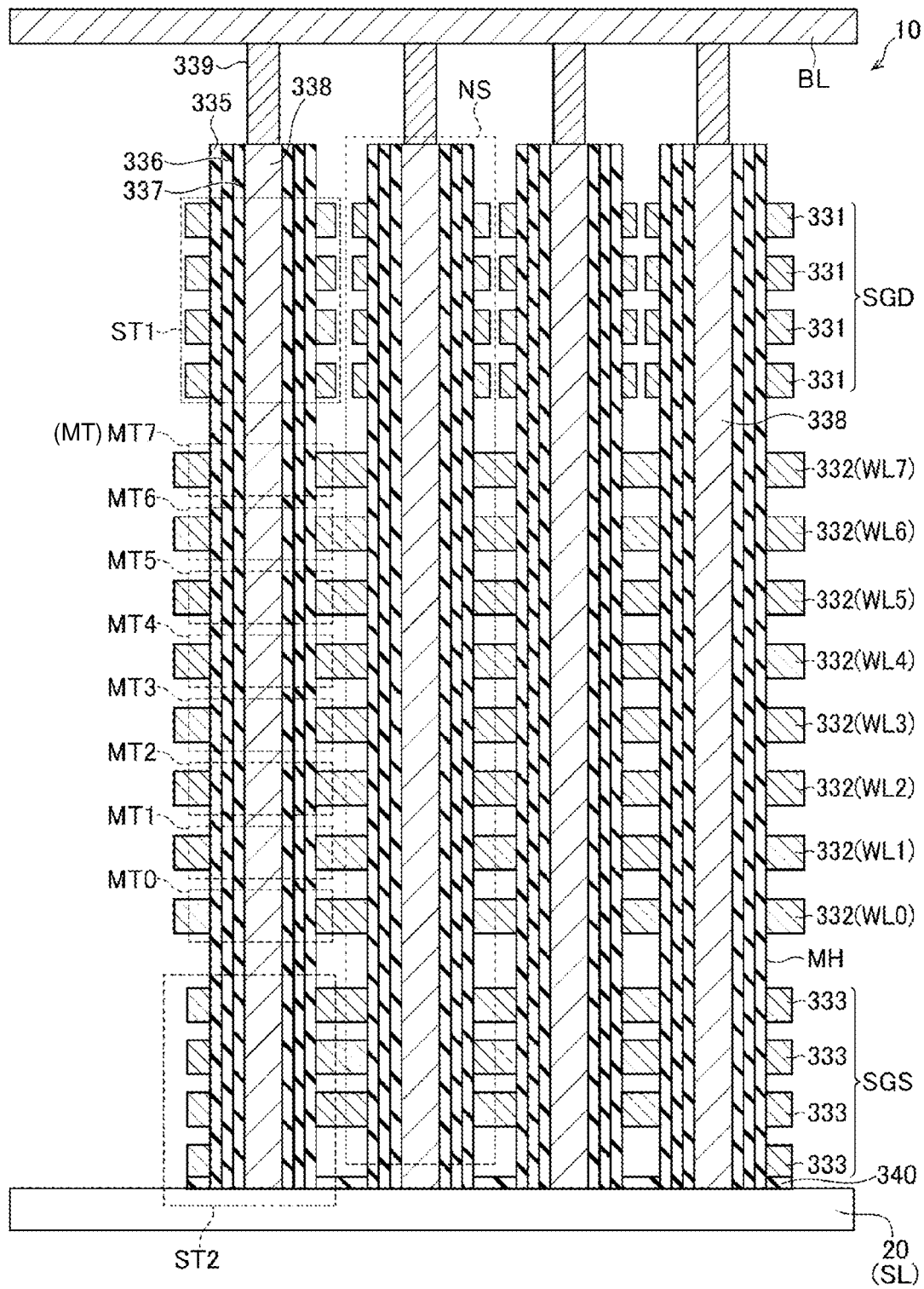
FIG. 2 is a cross-sectional diagram showing a configuration of a semiconductor device.

FIG. 2 shows a configuration of the semiconductor device 10 as a schematic cross-sectional view. As shown in FIG. 2, in the semiconductor device 10, a plurality of NAND strings NS are formed on the semiconductor substrate 20. The semiconductor substrate 20 is a silicon substrate having a front surface on which a p-type well region is formed. The semiconductor substrate 20 functions as the source line SL of FIG. 1.

A plurality of wiring layers 333 (functioning as the select gate line SGS), a plurality of wiring layers 332 (functioning as the word lines WL), and a plurality of wiring layers 331 (functioning as the select gate line SGD) are stacked above the semiconductor substrate 20. An insulating layer 40, which is not shown in FIG. 2 (but see FIG. 3), is provided between each adjacent pair of the stacked wiring layers 333, 332, and 331.

A plurality of memory holes MH are formed in the semiconductor device 10. Each memory hole MH is a hole that passes vertically through the wiring layers 333, 332, and 331 and the insulating layers 40 provided therebetween and reaches the semiconductor substrate 20. On the side surface of the memory hole MH, a block insulating film 335, a charge storage layer 336, and a tunnel insulating film 337 are sequentially formed, and a conductor pillar 338 is embedded on the inside thereof. The conductor pillar 338 is made of polysilicon, for example, and functions as a region in which a channel is formed during operation of the memory cell transistors MT and the select transistors ST1 and ST2, which are provided in the NAND string NS. As described above, a columnar body including the block insulating film 335, the charge storage layer 336, the tunnel insulating film 337, and the conductor pillar 338 is formed in the memory hole MH.

Portions of the columnar body formed in the memory hole MH, more particularly the portions intersecting the stacked wiring layers 333, 332, and 331, function as transistors. A portion intersecting with the wiring layers 331 functions as the select transistor ST1. Portions intersecting with the wiring layers 332 function as the memory cell transistors MT (MT0 to MT7). Of the transistors. A portion intersecting the wiring layers 333 functions as the select transistor ST2. This configuration allows each of the columnar bodies formed in the memory holes MH to function as a NAND string NS (as described with reference to FIG. 1). The conductor pillar 338 inside the columnar body is a portion functioning as a channel of each of the memory cell transistors MT and the select transistors ST1 and ST2.

A wiring layer functioning as the bit line BL is formed above the conductor pillar 338. A contact plug 339 connecting the conductor pillar 338 and the bit line BL is formed at the upper end of the conductor pillar 338.

A plurality of structural units similar to the structure shown in FIG. 2 are arranged in a depth direction (into the plane of the page) of FIG. 2. A set of a plurality of NAND strings NS arranged in a line in the depth direction FIG. 2 forms one string unit SU.

A method for manufacturing the semiconductor device 10 will be described. A film forming method which is performed by a film forming apparatus 500, which will be described below, is used in the course of the process of manufacturing the semiconductor device 10.

Stacking Process

Figure 3:
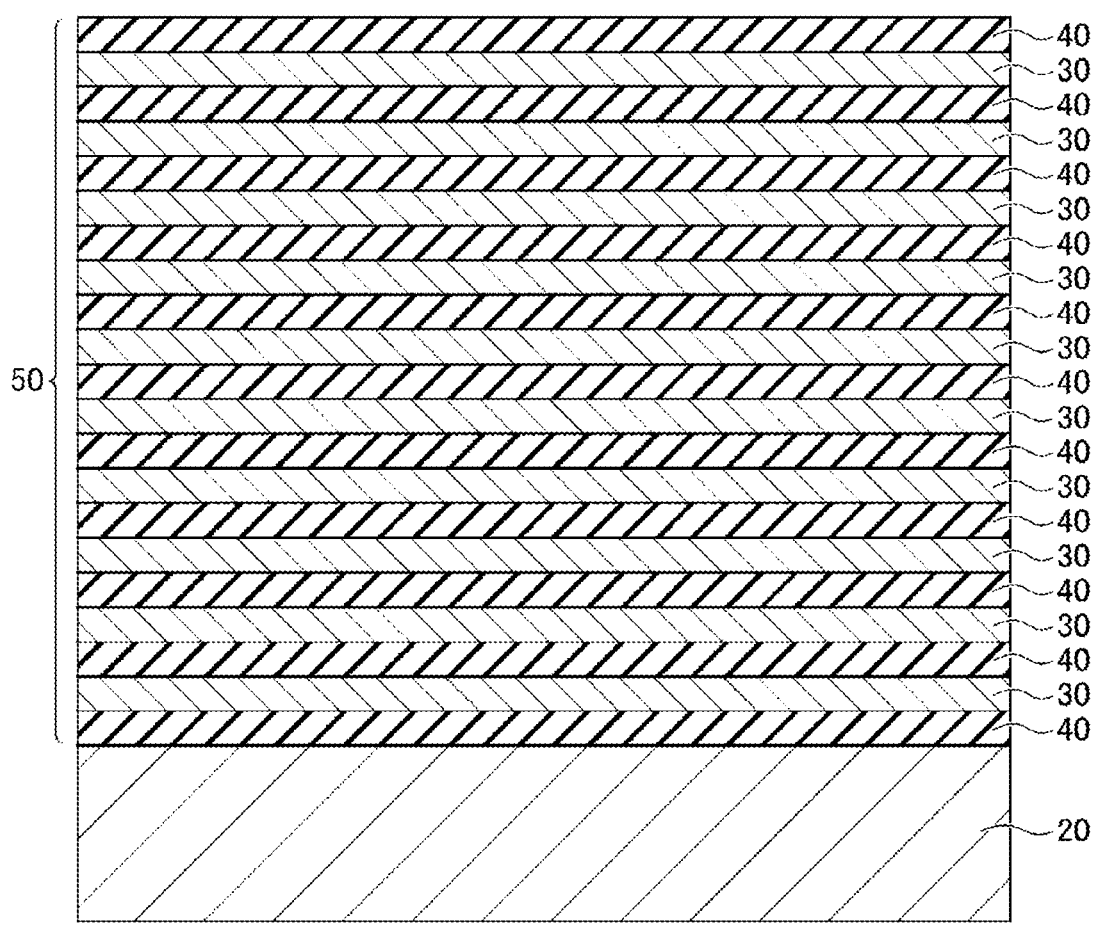
FIG. 3 is a cross-sectional diagram to show a process in a method for manufacturing a semiconductor device.

In a stacking process, a plurality of insulating layers 40 and a plurality of sacrificial layers 30 are alternately formed so as to cover the substantially the entire upper surface of the semiconductor substrate 20. FIG. 3 shows a state in which the stacking process has been completed. The sacrificial layers 30 are layers which will be replaced with a conductive material, such as tungsten, and ultimately become the wiring layers 331, 332, and 333. A film body including all of the stacked insulating layers 40 and sacrificial layers 30 is subjected to processing for forming the memory holes MH and the like as will be described below. For this reason, the film body including all of the stacked insulating layers 40 and the sacrificial layers 30 is also referred to below as the "film-to-be-processed 50" or a processing target 50.

Mask Formation Process

Figure 4:
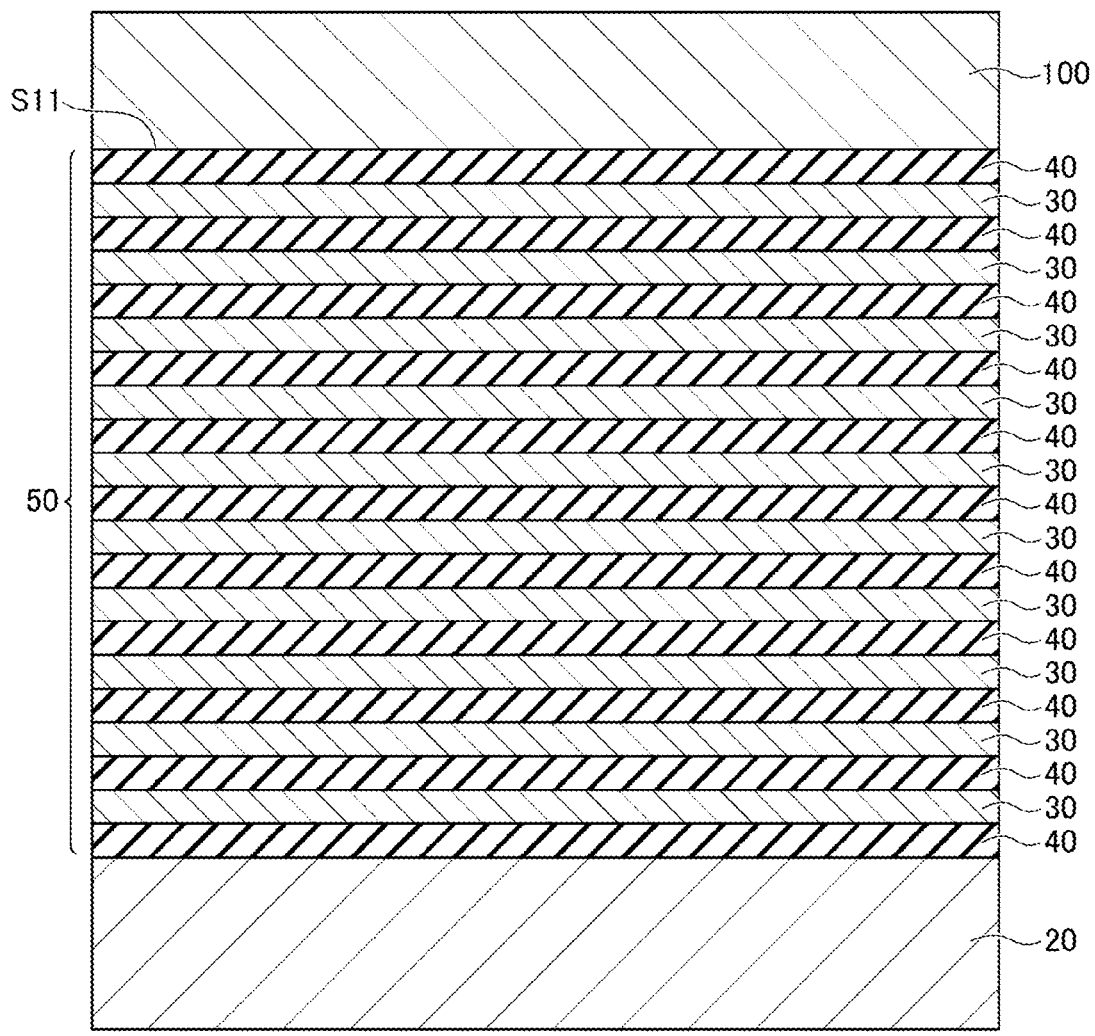
FIG. 4 is a cross-sectional diagram to show a process in a method for manufacturing a semiconductor device.
Figure 5:
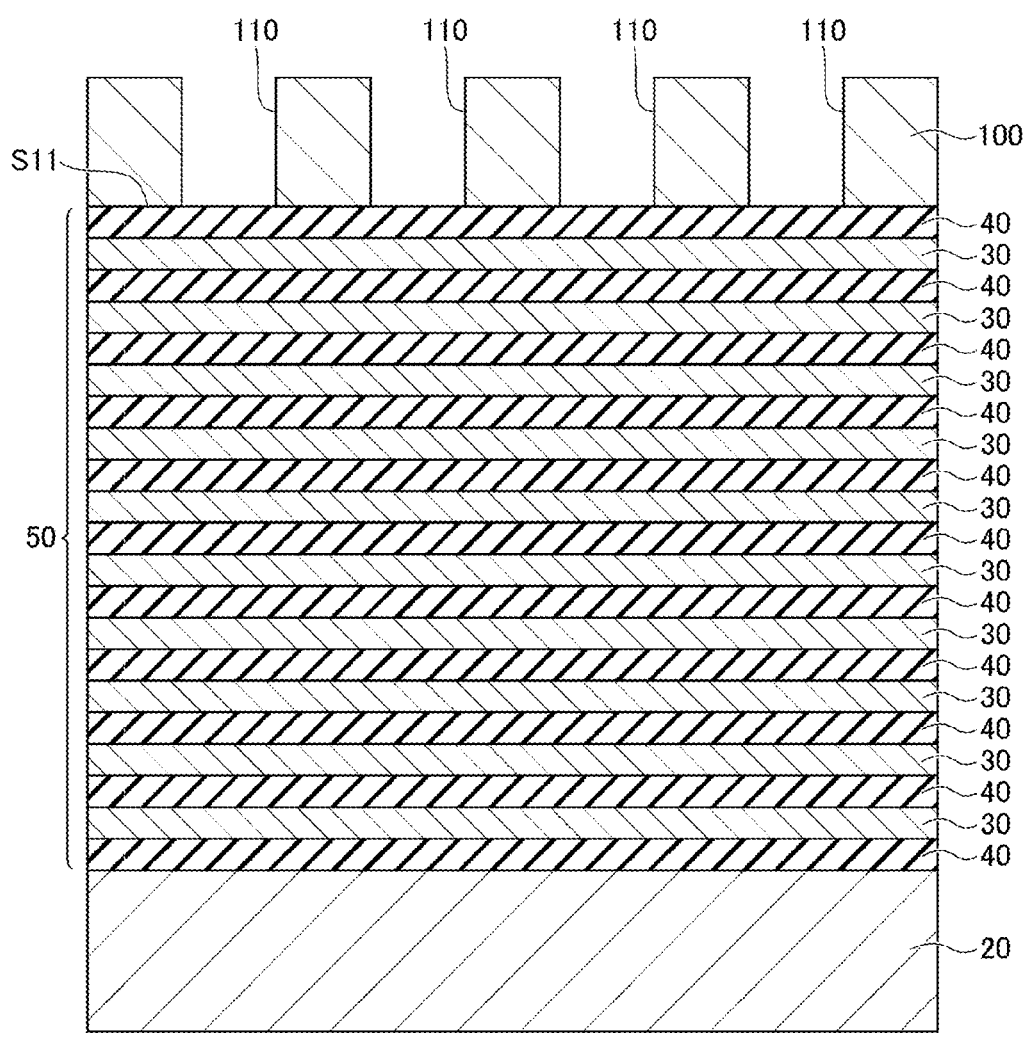
FIG. 5 is a cross-sectional diagram to show a process in a method for manufacturing a semiconductor device.

In a mask formation process that is performed after the stacking process, a mask 100 is formed on a front surface S11 of the processing target 50. The mask 100 may be referred to as a "first film" in the description of the present embodiment. In the mask formation process, the mask 100 is first formed as shown in FIG. 4 by a plasma treatment technique (plasma-assisted technique), such as plasma CVD, performed using the film formation apparatus 500. Then, as shown in FIG. 5, a plurality of openings 110 are formed in the mask 100. The openings 110 are formed in positions corresponding directly to the positions where the memory holes MH are to be formed in the processing target 50.

Memory hole Processing

Figure 6:
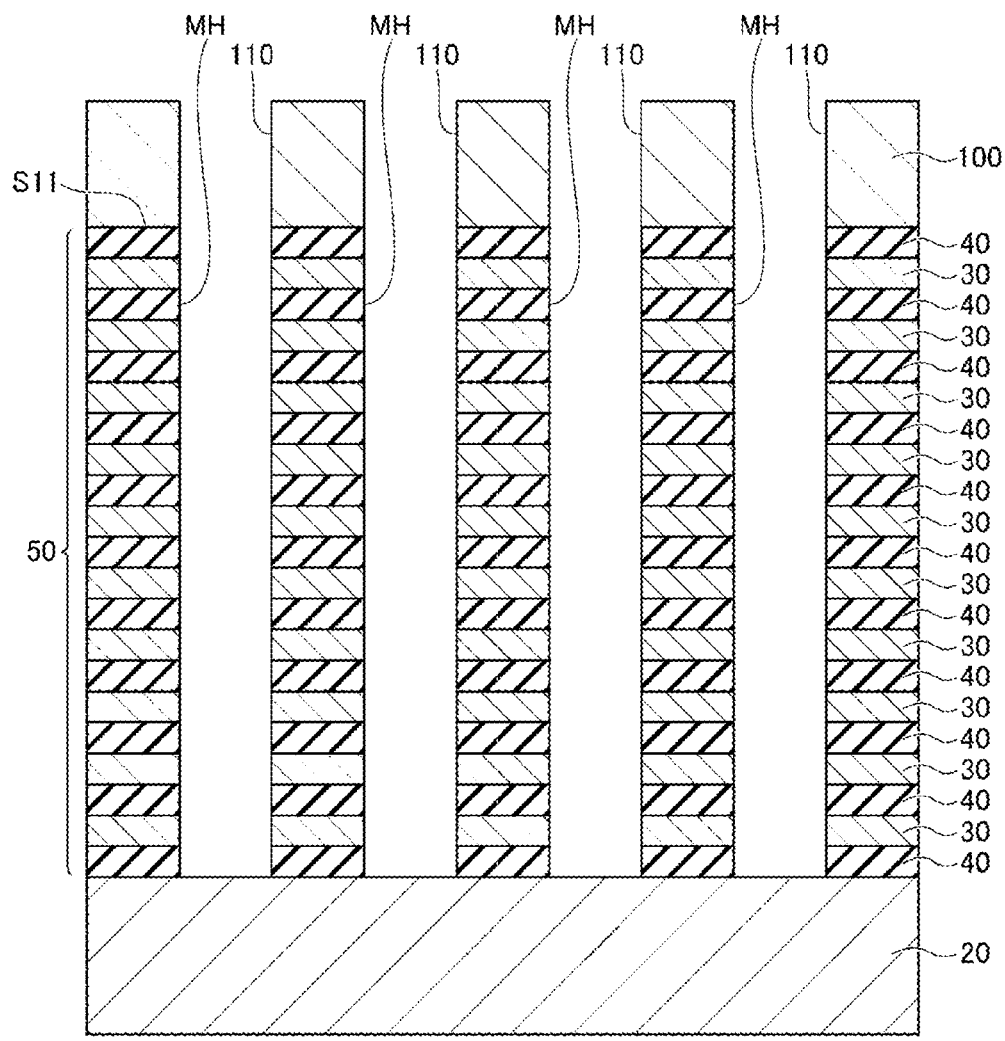
FIG. 6 is a cross-sectional diagram to show a process in a method for manufacturing a semiconductor device.

In a memory hole formation process, a plurality of memory holes MH are formed in the processing target 50 by reactive ion etching (RIE) which is performed through the mask 100 after the openings 110 have been formed. FIG. 6 shows the state after the memory hole processing has been completed. As shown in FIG. 6, each memory hole MH is formed to a depth that reaches the semiconductor substrate 20, which is the source line SL. Each memory hole MH passes through each of the insulating layers 40 and the sacrificial layers 30 in the processing target 50.

After the memory holes MH are completed, the mask 100 is removed by asking. Then, a columnar body (see FIG. 2)

including the block insulating film 335, the charge storage layer 336, the tunnel insulating film 337, and the conductor pillar 338 is formed in each memory hole MH. Moreover, the sacrificial layers 30 are replaced with conductive material and the wiring layers 331, 332, and 333 are thus formed. Then, the contact plugs 339, the bit lines BL, and the like are formed, and the semiconductor device 10 described with reference to FIGS. 1 and 2 is completed.

Figure 7A:
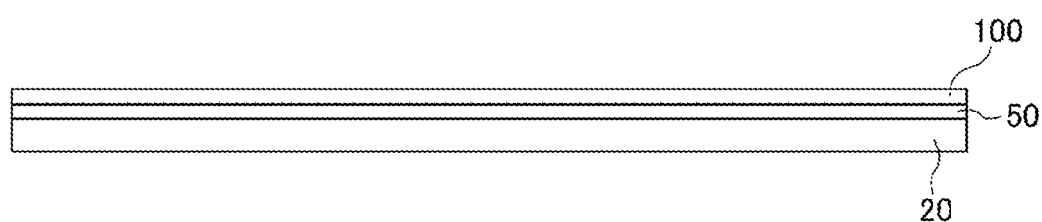
FIGS. 7A and 7B are diagrams depicting warpage which occurs in a body on which a film is to be formed.
Figure 7B:

As described above, in the mask formation process, the mask 100 is formed on the front surface S11 of the processing target 50. As shown in FIG. 7A, when the mask 100 is initially formed as a uniform film covering the entire upper surface of the processing target 50, high stress is produced due to, for example, a difference in coefficient of thermal expansion between the mask 100 and the processing target 50. As a result, as shown in FIG. 7B, warpage may occur in the semiconductor substrate 20.

In particular, when an increase in the depth of the memory hole MH is necessary due a desire for more stacking of memory transistors in the final device, a hard mask-type film having relatively high resistance to etching is often used as a material for mask 100. This tends to increase stress that is in the initially formed mask 100, which tends to cause larger warpage in the semiconductor substrate 20 shown in FIG. 7B. Warpage in the semiconductor substrate 20 is undesirable because it causes poor chucking of the semiconductor substrate in subsequent processes and/or causes a film to come off (peel) within the semiconductor substrate 20.

To address such an issue, the present embodiment is directed to reducing the warpage in the semiconductor substrate 20 by performing a specific film forming method using the film forming apparatus 500.

Figure 8A:
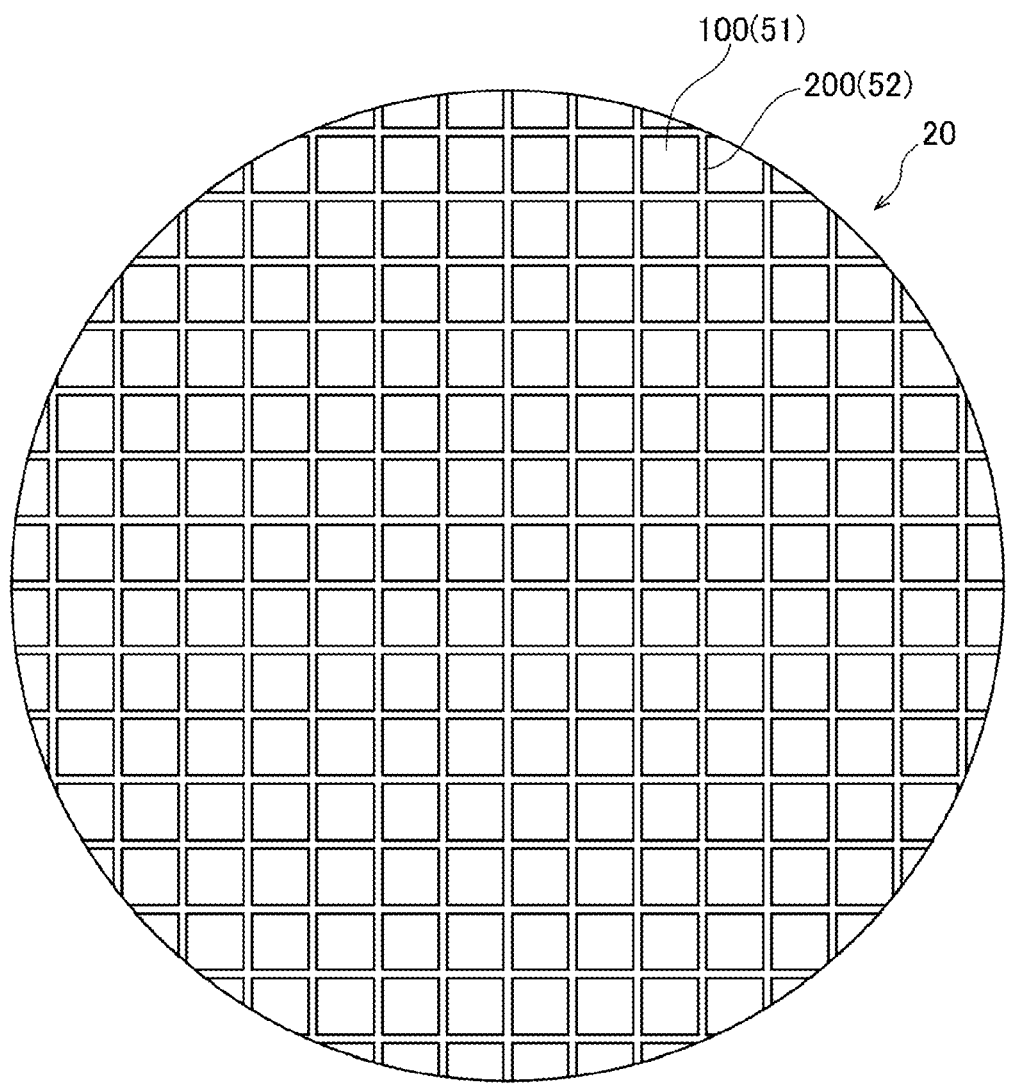
FIGS. 8A and 8B are diagrams showing a configuration of a mask formed through a film forming method according to an embodiment.
Figure 8B:
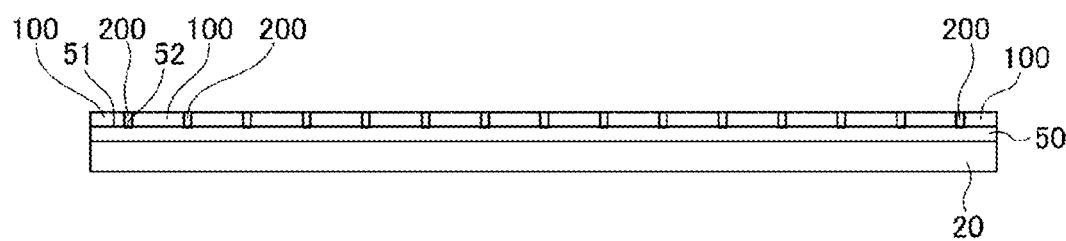

FIGS. 8A and 8B show the semiconductor substrate 20 with the mask 100 formed thereon by the film forming apparatus 500. The semiconductor substrate 20 is a semiconductor wafer such as a silicon wafer in this example. FIG. 8A is a diagram of the semiconductor substrate 20 viewed from above, and FIG. 8B is a diagram of the semiconductor substrate 20 viewed from the side.

As shown in FIGS. 8A and 8B, the mask 100 is formed divided into a plurality of rectangular regions on the upper surface of the semiconductor substrate 20 rather than as a single unitary film covering the entire surface of the semiconductor substrate 20. In a boundary portion between the regions of mask 100, the mask 100 is not formed, or alternatively the thickness thereof is extremely thin. That is, the film formation of the mask 100 is restricted to in certain areas, and a groove is formed between these regions of mask 100. Each mask 100 region may have, for example, a planar size corresponding to one chip or a planar size corresponding to a plurality of chips.

A filling film 200 made of a material that is different from the material for the mask 100 is formed in the boundary portion between the mask 100 regions so as to fill the groove. The material used for the filling film 200 causes less stress than the mask 100.

The mask 100 is formed so as to be divided into a plurality of regions and not as a uniform film covering the entire upper surface of the film to be processed 50. The stress in the whole of the mask 100 is significantly decreased as compared to the stress caused when the mask 100 is uniformly formed, which reduces warpage in the semiconductor substrate 20 due to the stress.

The semiconductor substrate 20 on which the processing target 50 is formed corresponds to a film forming target on which the mask 100 is to be formed. The portion of semiconductor substrate 20 that is covered by a portion of the mask 100 that is not covered by the filling film 200 in FIGS. 8A and 8B is also referred to as a "first portion 51" or a primary portion 51 in the following description. A portion of the semiconductor substrate 20 on which the film formation of the mask 100 was limited and covered with the filling film 200 in FIGS. 8A and 8B is also referred to as a "second portion 52" in the following description.

Figure 9:
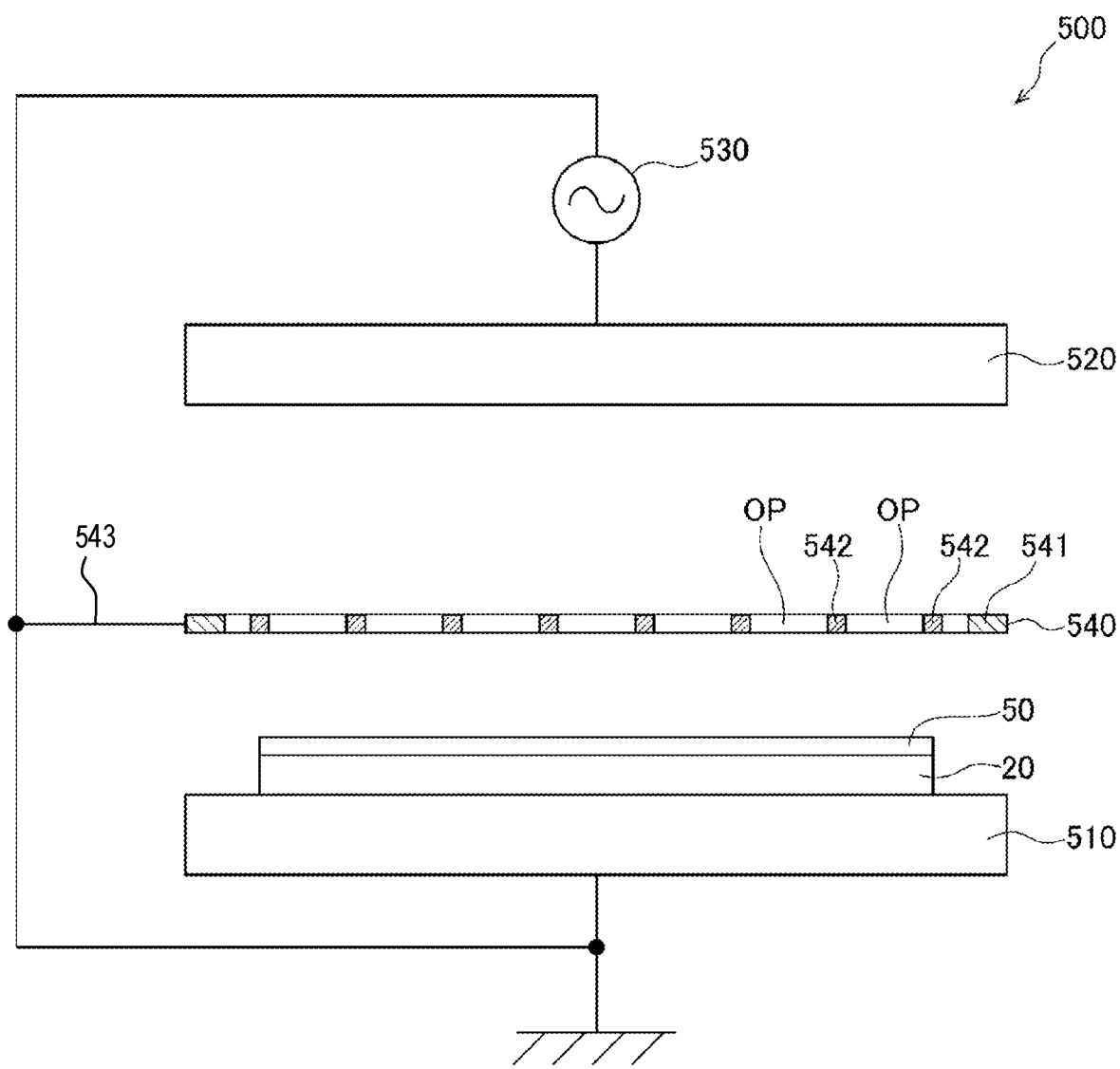
FIG. 9 is a diagram of a film formation apparatus according to an embodiment.

The film forming apparatus 500 to implement this film formation technique will be described. FIG. 9 schematically shows a configuration of the film forming apparatus 500. The film forming apparatus 500 of the present embodiment is configured as a plasma CVD apparatus. The film forming apparatus 500 includes a holding portion 510, an electrode 520, a power supply 530, and a prevention member 540 (also referred to as a masking shield 540).

The holding portion 510 is a portion that holds the semiconductor substrate 20 on which a film is to be formed. The holding portion 510 may be referred to as a target holder. A mechanical chuck, an electrostatic chuck, or the like, for example, may be used as the holding portion 510. The holding portion 510 fixes the semiconductor substrate 20 by holding the semiconductor substrate 20 from below such that the film to be processed 50 is facing upward (away from the holding portion 510). The holding portion 510 is configured with a conductive material and grounded together with the semiconductor substrate 20.

The electrode 520 is disposed above the holding portion 510 in such a way as to face the holding portion 510. The electrode 520 is an electrode for generating plasma by generating a high-frequency RF field between the electrode 520 and the holding portion 510. The electrode 520 in this example doubles as a so-called shower head for supplying gas which is a raw material for plasma formation and deposition.

The power supply 530 is a power supply device for generating an electric field by applying a high-frequency alternating voltage between the holding portion 510 and the electrode 520 facing each other.

Figure 10:
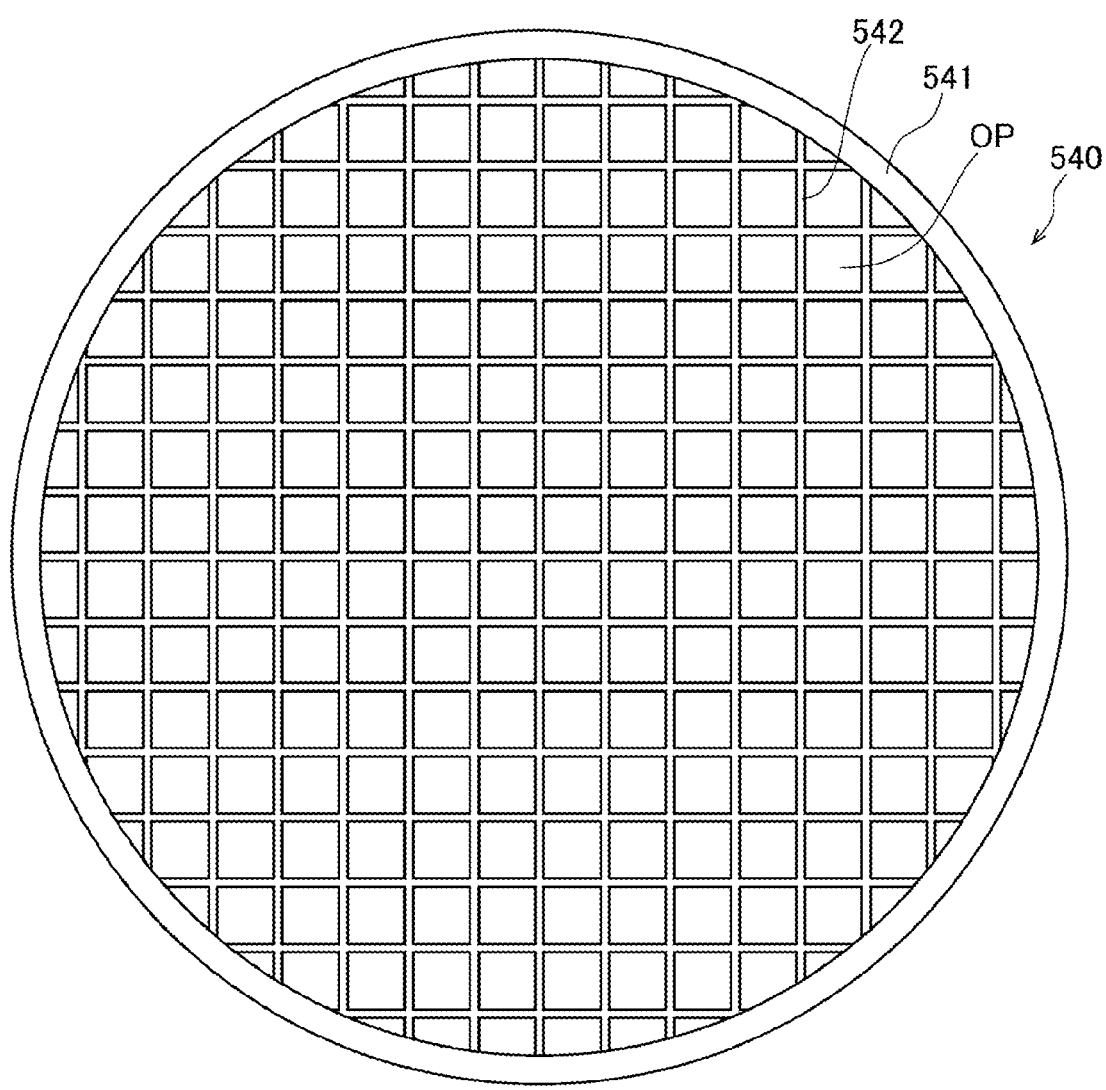
FIG. 10 is a diagram showing a mask shield used in the film formation apparatus according to an embodiment.

The prevention member 540 is a member that is disposed on or above the front surface of the processing target 50 in order to prevent or inhibit film formation on the second portion 52. In FIG. 9, the prevention member 540 is drawn as a schematic cross-sectional view. In FIG. 10, the configuration of the prevention member 540 viewed from above is drawn. As shown in FIG. 10, the prevention member 540 includes a ring portion 541 and a lattice portion 542. The whole of the prevention member 540 is configured of a conductive material such as metal, for example. The prevention member 540 is held by a masking shield holder 543.

The ring portion 541 is an annular member for supporting the lattice portion 542 on the inside of the ring portion 541. The inside diameter of the ring portion 541 is larger than the diameter of the upper surface of the processing target 50. The ring portion 540 is an example of a frame portion.

The lattice portion 542 is a lattice-shaped member disposed on the inside of the ring portion 541. A plurality of rectangular openings OP are formed in the lattice portion 542. The shape of each opening OP is not limited to a particular shape; but, in this example, the shape of each opening OP is roughly the same as the shape of each chip when the semiconductor substrate 20 is diced in a subsequent process. In other words, the lattice portion 542 may be formed along the lines along which dicing is performed (dicing lines or streets). It is to be noted that the portion of the semiconductor substrate 20 which is covered by the lattice portion 542 is not limited to a position directly on each line along which dicing is performed as mentioned above but may be some other portion. In either case, it is generally preferable that the lattice portion 542 is formed so as to cover a position which does not overlap with a device pattern which is to be formed using the mask 100.

In a state in which the prevention member 540 is disposed above the semiconductor substrate 20 being held by the holding portion 510, a part of the processing target 50 is covered with the lattice portion 542. The other parts of the film to be processed 50 are left uncovered upward through the openings OP. As shown in FIG. 9, the prevention member 540 is grounded together with the holding portion 510.

The film formation method performed using the film forming apparatus 500 will be described. This film formation is performed to form the mask 100 in the mask forming process described earlier.

In the mask forming process the semiconductor substrate 20 on which the processing target 50 has been formed is placed on the upper surface of the holding portion 510 and is held by the holding portion 510. FIG. 9 shows a state observed immediately after the semiconductor substrate 20 was placed on the holding portion 510.

It is to be noted that the prevention member 540 is held by the masking shield holder 543 that can move in an up-and-down direction. When the semiconductor substrate 20 is placed on the upper surface of the holding portion 510, the masking shield holder 543 moves the prevention member 540 upward in advance. This keeps the movement of the semiconductor substrate 20 from being interfered with by the prevention member 540.

Figure 11:
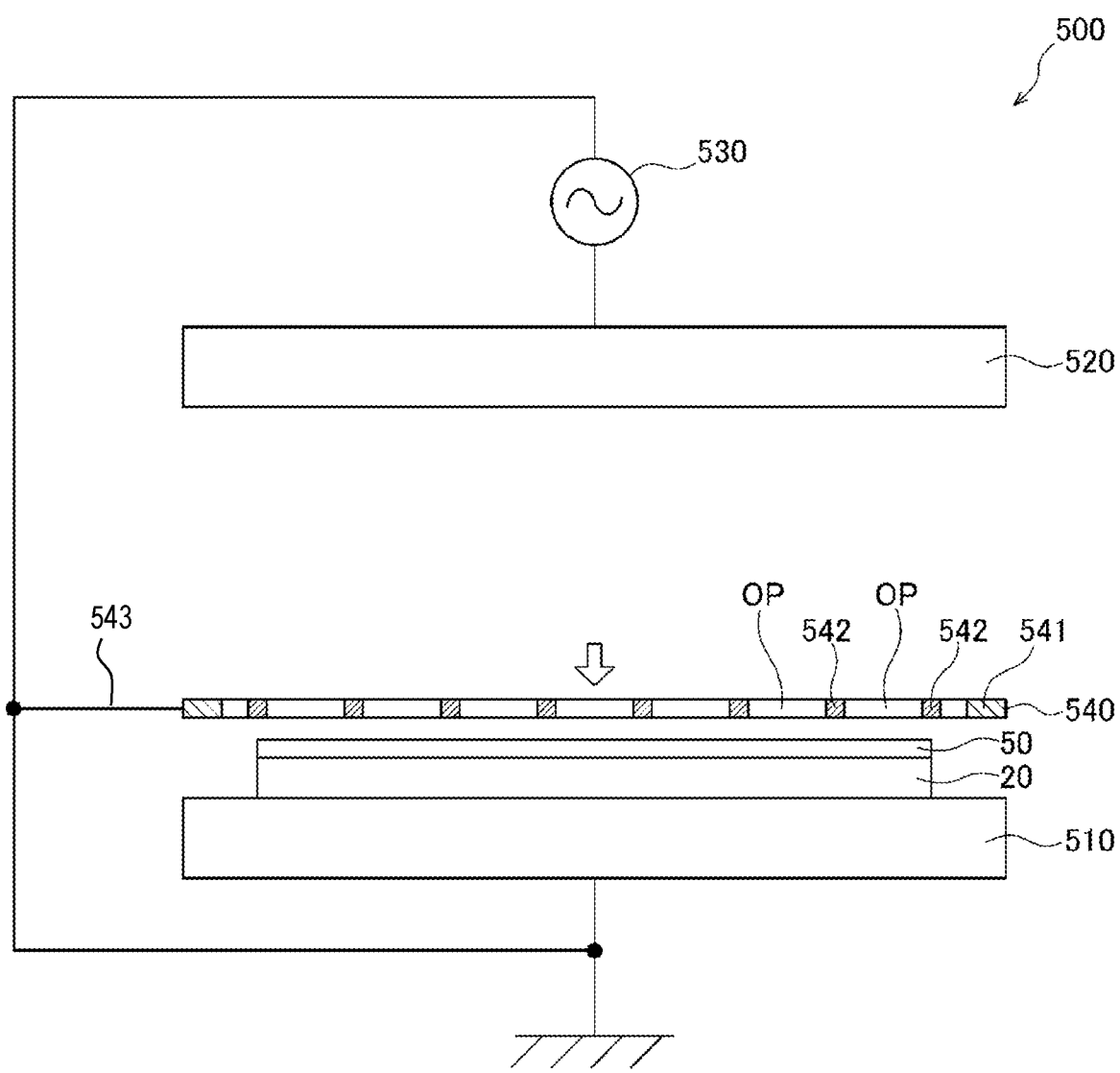
FIGS. 11-17 are diagrams showing aspects of a film forming method according to an embodiment.

After the semiconductor substrate 20 is placed on the upper surface of the holding portion 510, the masking shield holder 543 moves the prevention member 540 downward and disposes the prevention member 540 proximate to the front surface of the processing target 50. FIG. 11 shows a state after the movement of the prevention member 540 has been completed. In this state, the whole of the lattice portion 542 is parallel to the upper surface of the processing target 50 and the lattice portion 542 is close to the upper surface of the processing target 50.

Figure 12:
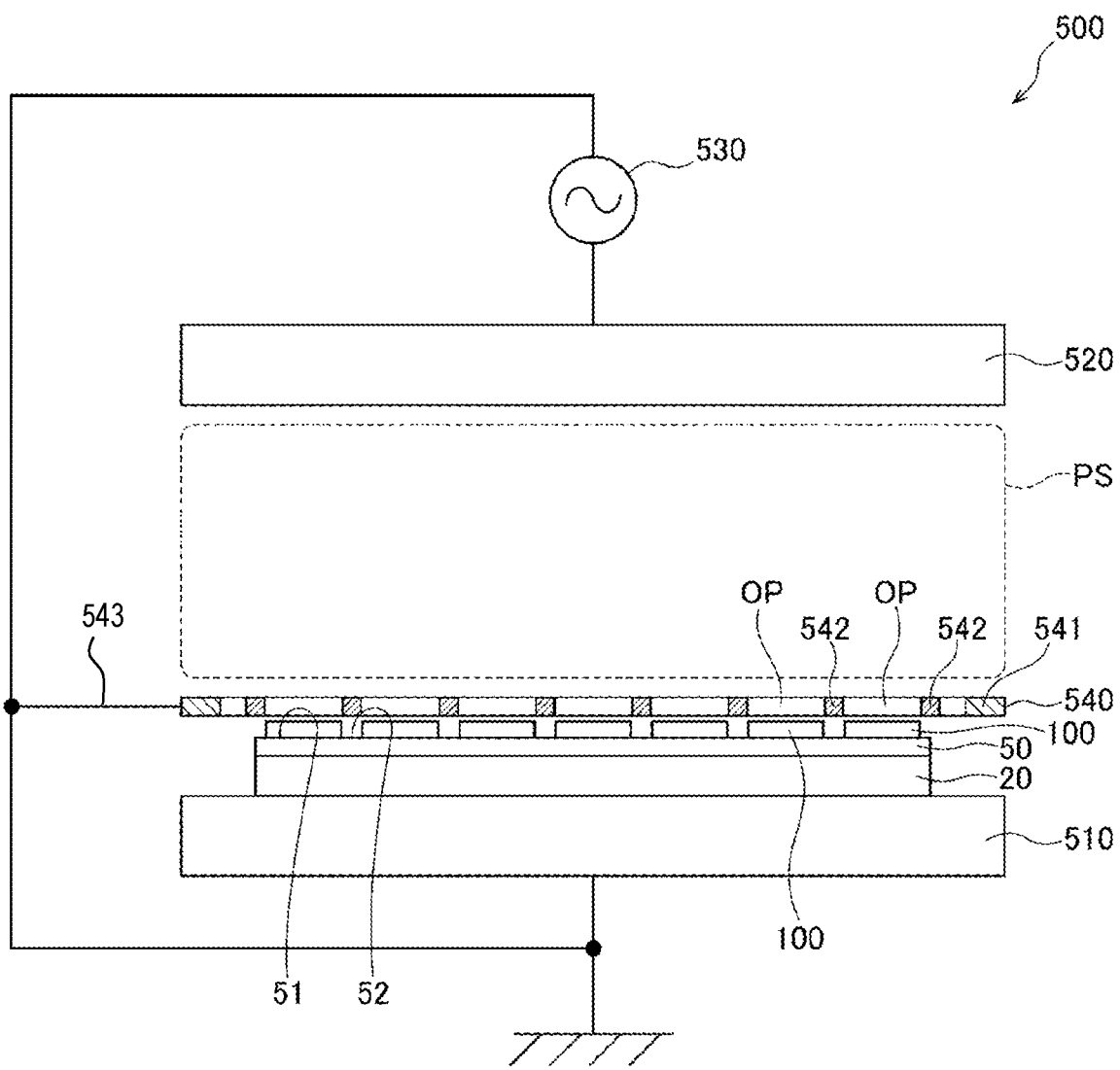

In this state, a high-frequency voltage is applied between the holding portion 510 and the electrode 520 and gas is supplied downward from the electrode 520. Plasma PS is generated between the holding portion 510 and the electrode 520 and part thereof reaches the front surface of the processing target 50 that is located below, whereby the mask 100 is formed. FIG. 12 shows a state in which film formation is being performed in this manner.

In this example, mask 100 is a diamond-like carbon (DLC) film containing carbon atoms with a total atomic composition ratio of 90% or more with the balance being hydrogen atoms (total atomic composition ratio is 10% or less). The mask 100 may further contain impurity atoms such as tungsten atoms, boron atoms, nitrogen atoms, and oxygen atoms. In either case, the mask 100 is formed as a relatively hard film containing carbon as a principal component and the density thereof is 2.0 g/cm$^3$ or more, for example. The mask 100 may be formed as a film containing a material other than carbon, such as metal, as a principal component.

Active species, such as ions, which are the material for the mask 100 reach the front surface of the processing target 50 from the plasma PS through the openings OP of the prevention member 540. Thus, as schematically shown in FIG. 12, on a portion of the front surface of the processing target 50 which is located directly under the lattice portion 542, since the active species (film formation material) are kept from reaching the processing target 50 by the lattice portion 542, the film formation of the mask 100 is prevented or inhibited. On the other hand, in portions, which are located directly under the openings OP, the film formation of the mask 100 is not restricted. Therefore, the thick mask 100 portion is formed in the portions directly under the openings OP and almost no mask 100 is formed in the portion directly under the lattice portion 542, whereby a groove lattice in the mask 100 is correspondingly formed.

The portions located directly under the openings OP each correspond to the "first portion 51" because they are the portions in which the film formation of the mask 100 was not restricted. The portions located directly under the lattice portion 542 corresponds to "second portions 52" because the film formation of the mask 100 is restricted as mentioned above.

To reliably prevent film formation directly under the lattice portion 542, it is preferable that the thickness of the lattice portion 542 is larger than the thickness of a sheath between the plasma PS and the processing target 50.

In the present embodiment, the whole of the prevention member 540 is formed so as to mainly contain the conductive material. When a material having conductivity is used as the material for the mask 100 as in the present embodiment, it is preferable that the prevention member 540 is also formed mainly of a conductive material. On the other hand, when an insulating material is mainly used as the material for the mask 100, it is preferable that the prevention member 540 is also formed mainly of an insulating material. In this configuration, even when the film formation material is being deposited on the upper surface of the prevention member 540, the conductivity of the prevention member 540 is less likely to change during film formation, which makes it possible to perform film formation under stable conditions.

Figure 13:
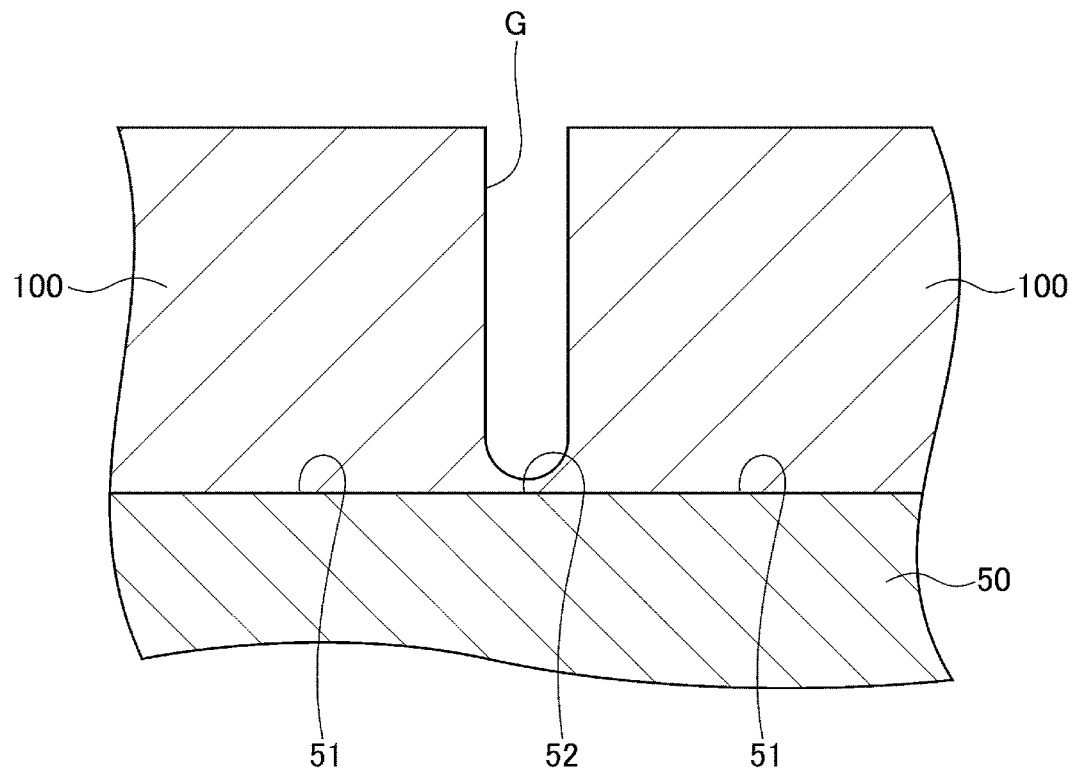

FIG. 13 shows a portion, which is enlarged, near the second portion 52. As shown in FIG. 13, a recess-shaped groove G is formed directly on the second portion 52 because the film formation of the mask 100 was restricted there. A thin mask 100 portion may be formed on a bottom portion of the groove G as shown in an example of FIG. 13; the front surface of the processing target 50 may be exposed. This groove G is formed as a lattice-shaped groove corresponding to the lattice portion 542 when viewed from above.

As described above, the film forming apparatus 500 according to the present embodiment includes or functions with the prevention member 540 that restricts film formation on a part of the front surface of the body (i.e., the semiconductor substrate 20 on which the processing target 50 has been formed). The prevention member 540 is disposed along the front surface of the body which is held by the holding portion 510, and thereby restricts film formation on a part of the front surface. The prevention member 540 is configured such that the first portion 51, in which film formation is not restricted, is divided into a plurality of regions by the second portion 52 in which film formation is restricted.

In the process of manufacturing the semiconductor device 10, the mask forming process of forming the mask 100 with the film forming apparatus 500 includes a process (FIG. 9) of holding the semiconductor substrate 20 on which the processing target 50 has already been formed, a process (FIG. 11) of disposing the prevention member 540 above the front surface of the processing target 50, and a process (FIG. 12) of performing film formation on the front surface of the processing target 50 by depositing the film formation material on the front surface of the processing target 50 through the prevention member 540. As a result of these processes, the mask 100 is formed so as to be divided into a plurality of regions. This decreases the stress in the mask 100 and makes it possible to reduce warpage in the semiconductor substrate 20 due to the stress.

When RIE is performed via the mask 100 in the memory hole formation process with the inside of the groove G exposed as shown in FIG. 13, any portion of mask 100 directly on the second portion 52 generally disappears at an early stage of the etch process and the processing target 50 previously under the mask 100 will otherwise be etched. For this reason, in the present embodiment, the filling film 200 is formed so as to fill the groove G as described earlier. The formation of the filling film 200 is performed by an apparatus different from the film forming apparatus 500.

Figure 14:
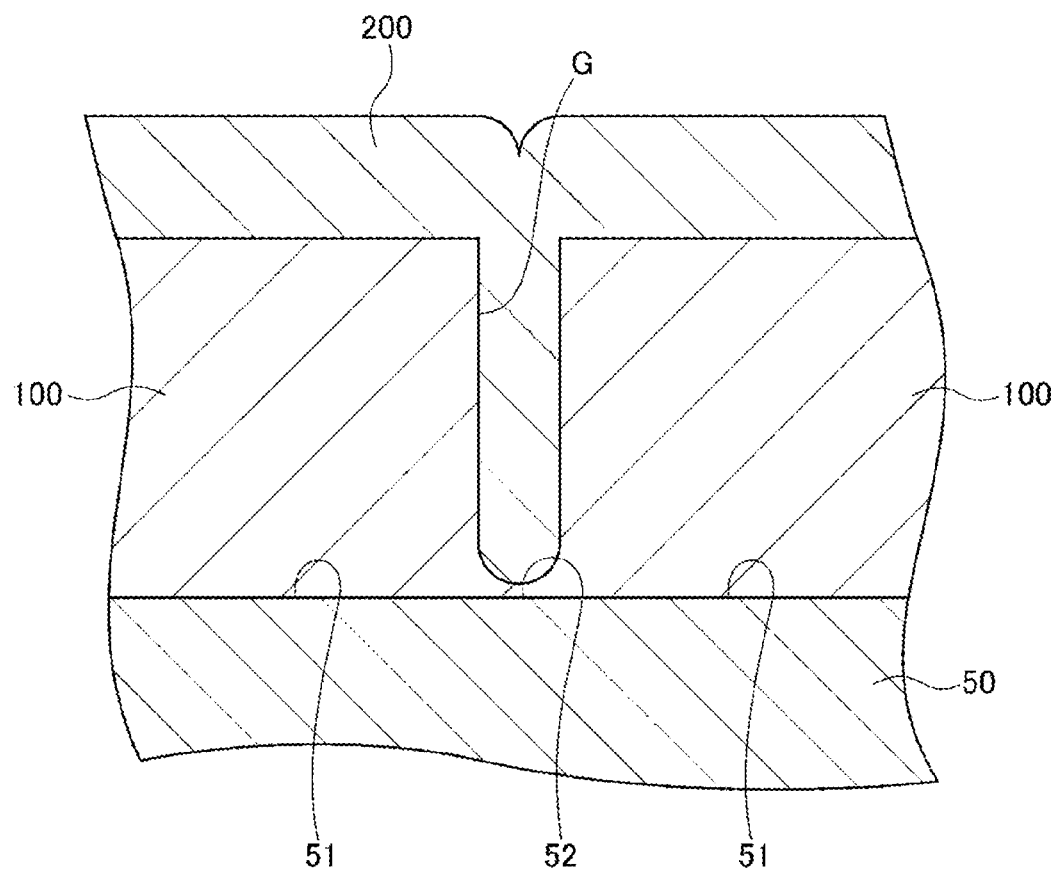

First, as shown in FIG. 14, the filling film 200 is formed so as to cover the entire front surface of the mask 100. The filling film 200 is a film whose composition is different from the composition of the mask 100, and corresponds to a "second film" in the present embodiment. In the present context, a "film whose composition is different from the composition of the mask 100" includes a film that contains or may contain components, some of which (for example, carbon) are also contained in the mask 100. As the material for the filling film 200, a material which makes the hardness of the filling film 200 lower than the hardness of the mask 100 and causes stress in the filling film 200 to be lower than stress in the mask 100 is used. In the present embodiment, the filling film 200 is formed using, as a material therefor, a carbon film whose density is lower than the density of the mask 100. The formation of the filling film 200 may be performed by physical application techniques (e.g., spin casting), or may be performed deposition methods such as plasma CVD or the like. In any event, the density of the filling film 200 is 2.0 g/cm$^3$ or less, for example.

Figure 15:
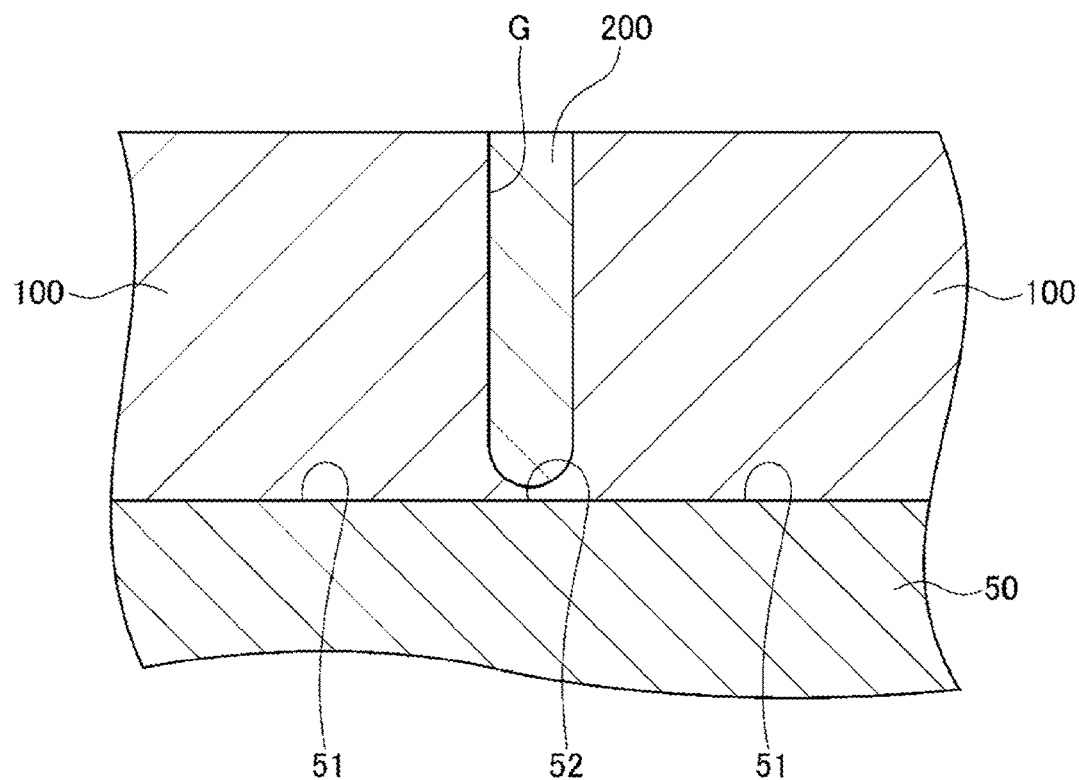

After the filling film 200 is formed as shown in FIG. 14, the front surface of the filling film 200 is etched back and/or CMP is performed thereon as necessary. This causes the filling film 200 to be removed with a portion being left inside the groove G left as shown in FIG. 15, such that the upper surface of the filling film 200 is flush with the upper surface of the mask 100. As a result, the semiconductor substrate 20 shown in FIGS. 8A and 8B described earlier is obtained.

Figure 16:
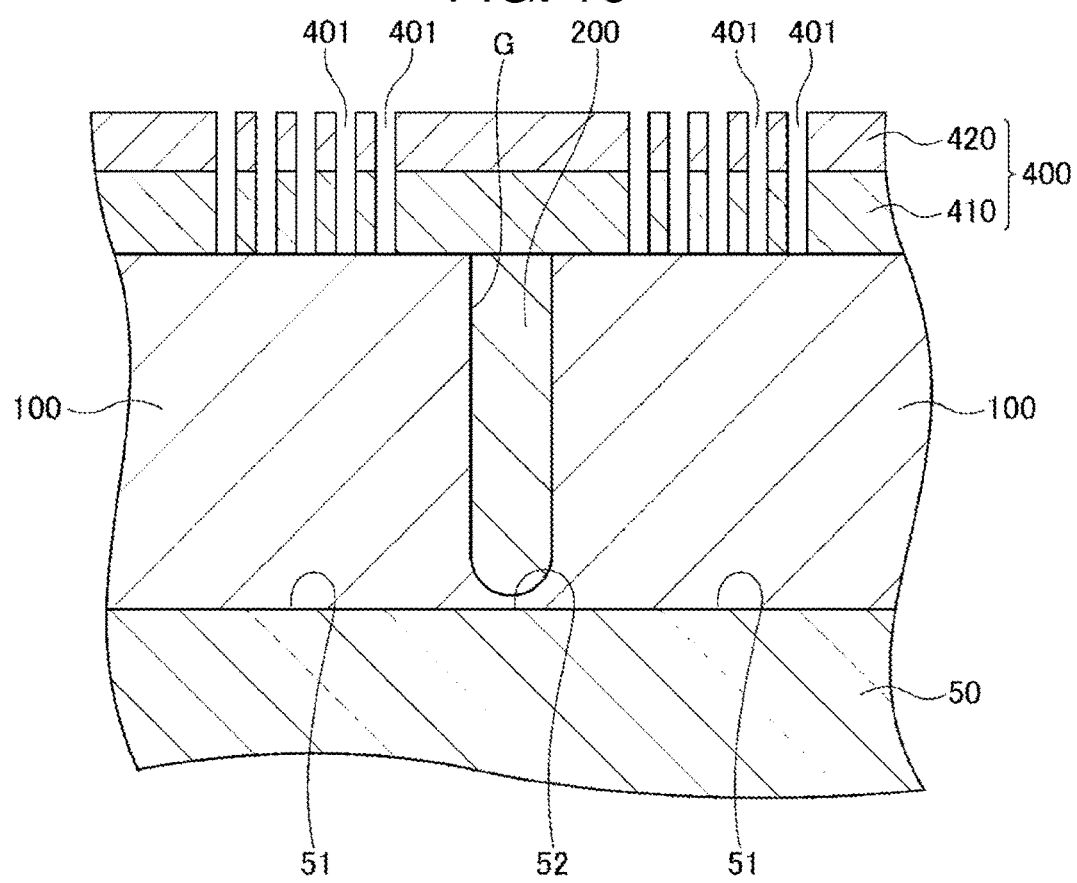

Then, a plurality of openings 110 shown in FIG. 5 are formed in the mask 100. Specifically, first, resist films 410 and 420, which are two layers, are formed so as to cover the front surface of the mask 100. As shown in FIG. 16, the resist film 410 is formed so as to cover the mask 100 and the resist film 420 is formed so as to cover the resist film 410.

Openings 401 are then formed using photolithography and RIE so as to pass through the resist films 410 and 420. The openings 401 are circular openings which are formed in positions corresponding to the openings 110, that is, positions corresponding to the memory holes MH.

Figure 17:
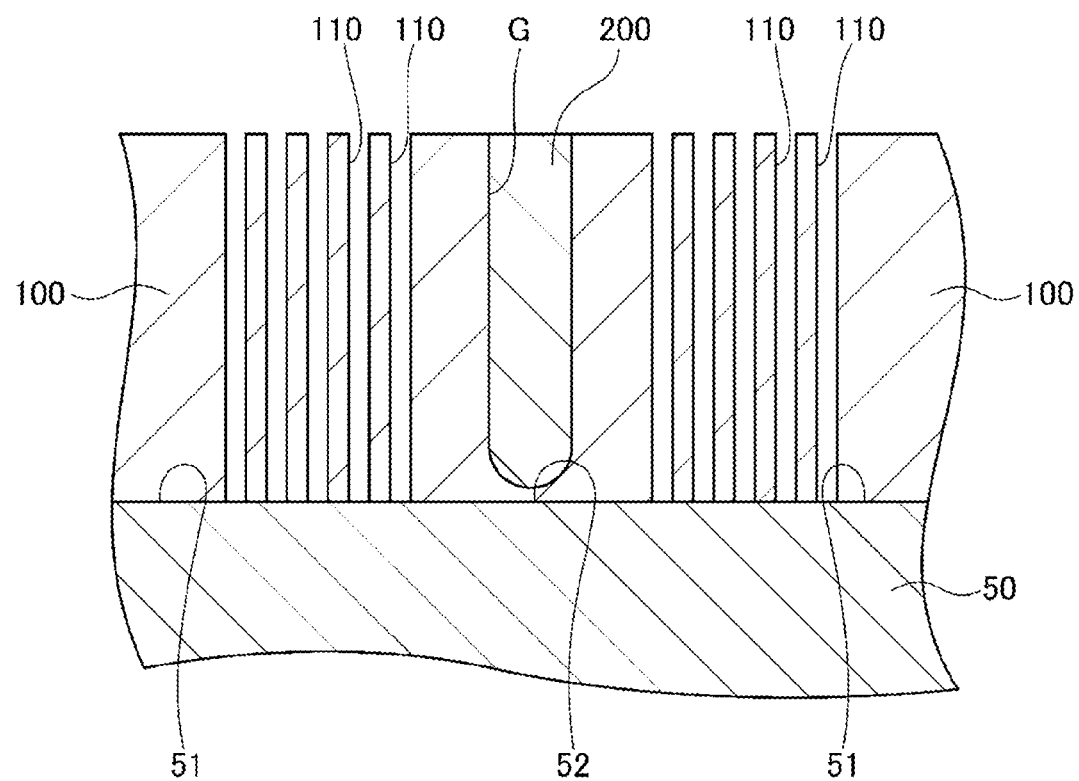

Then, portions of the mask 100 which are located directly under the openings 401 are etched by RIE using the resist films 410 and 420 as a mask, and the openings 110 are formed. To make the above processing possible, it is only necessary to form the resist film 410 using a photosensitive material and form the resist film 420 using a material having resistance to etching. After the formation of the openings 110 is completed, the resist films 410 and 420 are removed by asking. FIG. 17 shows a state after the removal of the resist films 410 and 420.

The MH processing process described earlier is then performed using the mask 100 shown in FIG. 17. This process is a process of processing the processing target 50 using a structure including the mask 100 (the first film) and the filling film 200 (the second film) as an etch mask.

As described above, the film forming method which is used in the present embodiment further includes a process of performing film formation of the mask 100 on the front surface of the processing target 50 by making the film formation material reach the front surface through the prevention member 540, and then forming the filling film 200, which is made of a material different from the above-mentioned film formation material, directly on the second portion 52 (that is, in the groove G). As a result, it is possible to decrease stress by dividing the mask 100 into a plurality of regions and, at the same time, ensure resistance to etching in the boundary portion (portion covered by the filling film 200) between the full thickness regions of the mask 100.

The filling film 200 generally has lower resistance to etching than the mask 100. However, a portion in which the filling film 200 is formed is a portion having a low etching rate from the beginning because objects to be processed, such as the memory holes MH, are not densely arranged in that boundary portion. Therefore, even when the filling film 200 has lower resistance to etching, the filling film 200 does not entirely disappear at the time of formation of the memory holes MH.

The film forming method described above may be applied to various film forming processes of the process of manufacturing the semiconductor device 10. The present embodiment deals with a case where the mask 100 is formed by CVD; the film forming method using the prevention member 540, which was described in the present embodiment, may also be applied to film formation by PVD such as sputtering. Moreover, the film forming method using the prevention member 540, which was described in the present embodiment, is not limited to the process of manufacturing the semiconductor device 10 and can also be applied to other film forming processes.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
   forming a masking layer on a processing target that is on a substrate, the masking layer comprising a first film having a plurality of primary portions partitioned by a groove region, a second film selectively within and filling the groove region;
   lithographically patterning and then etching the primary portions to form a patterned masking layer; and
   processing the processing target using the patterned masking layer,
   the processing target comprises a plurality of first-type films and a plurality of second-type films that are alternately stacked on the substrate.

2. The method according to claim 1, wherein the first film has a first thickness in the primary portions and a second thickness less than the first thickness in the groove region.

3. The method according to claim 1, wherein the processing of the processing target comprises etching a plurality of memory holes in the processing target using the patterned masking layer as an etch mask.

4. The method according to claim 1, wherein no first film is in the groove region.

5. The method according to claim 1, wherein a hardness of the first film is greater than a hardness of the second film.

6. The method according to claim 1, wherein the first film is a diamond-like carbon (DLC) film.

7. A method for manufacturing a semiconductor device, comprising:
   forming a masking layer on a processing target that is on a substrate, the masking layer comprising a first film having a plurality of primary portions partitioned by a groove region, a second film selectively within and filling the groove region;
   lithographically patterning and then etching the primary portions to form a patterned masking layer; and
   processing the processing target using the patterned masking layer,
   wherein a hardness of the first film is greater than a hardness of the second film.

8. The method according to claim 7, wherein the first film has a first thickness in the primary portions and a second thickness less than the first thickness in the groove region.

9. The method according to claim 7, wherein no first film is in the groove region.

10. The method according to claim 7, wherein the first film is a diamond-like carbon (DLC) film.

\* \* \* \* \*